United States Patent
Gupta et al.

(10) Patent No.: US 7,791,107 B2
(45) Date of Patent: Sep. 7, 2010

(54) STRAINED TRI-CHANNEL LAYER FOR SEMICONDUCTOR-BASED ELECTRONIC DEVICES

(75) Inventors: Saurabh Gupta, Cambridge, MA (US); Minjoo Larry Lee, Cambridge, MA (US); Eugene A. Fitzgerald, Windham, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/869,463

(22) Filed: Jun. 16, 2004

(65) Prior Publication Data

US 2005/0279992 A1 Dec. 22, 2005

(51) Int. Cl.
*H01L 21/3205* (2006.01)

(52) U.S. Cl. ............ 257/192; 257/19; 257/24; 257/616; 257/E21.403; 257/E21.632; 257/E21.633; 438/590

(58) Field of Classification Search .......... 257/19, 257/616, 24, 192; 438/590
See application file for complete search history.

(56) References Cited

U.S. PATENT DOCUMENTS

| | | | |
|---|---|---|---|
| 4,665,415 A | 5/1987 | Esaki et al. | |
| 5,534,713 A | 7/1996 | Ismail et al. | |
| 6,339,232 B1* | 1/2002 | Takagi | 257/192 |
| 6,472,685 B2 | 10/2002 | Takagi | |
| 6,677,192 B1 | 1/2004 | Fitzgerald | |
| 6,955,952 B2* | 10/2005 | Yeo et al. | 438/154 |
| 7,282,402 B2* | 10/2007 | Sadaka et al. | 438/221 |
| 7,417,250 B1* | 8/2008 | Buller et al. | 257/65 |
| 2002/0008289 A1 | 1/2002 | Murota et al. | |
| 2002/0011628 A1 | 1/2002 | Takagi | |
| 2002/0125497 A1* | 9/2002 | Fitzgerald | 257/191 |
| 2002/0125502 A1* | 9/2002 | Baba et al. | 257/200 |
| 2002/0197803 A1 | 12/2002 | Leitz et al. | |
| 2003/0025131 A1 | 2/2003 | Lee et al. | |
| 2003/0155592 A1* | 8/2003 | Shima et al. | 257/288 |
| 2004/0171223 A1* | 9/2004 | Hammond et al. | 438/285 |
| 2005/0274978 A1* | 12/2005 | Antoniadis et al. | 257/192 |

(Continued)

FOREIGN PATENT DOCUMENTS

EP 0683522 A2 11/1995

(Continued)

OTHER PUBLICATIONS

Maiti et al. "Strained-Si heterostructure field effect transistors" semicond. Sci. Technol. 13 (1998) 1225-1246.*

(Continued)

*Primary Examiner*—A. Sefer
(74) *Attorney, Agent, or Firm*—Wolf, Greenfield & Sacks, P.C.

(57) ABSTRACT

A semiconductor-based structure includes a substrate layer, a compressively strained semiconductor layer adjacent to the substrate layer to provide a channel for a component, and a tensilely strained semiconductor layer disposed between the substrate layer and the compressively strained semiconductor layer. A method for making an electronic device includes providing, on a strain-inducing substrate, a first tensilely strained layer, forming a compressively strained layer on the first tensilely strained layer, and forming a second tensilely strained layer on the compressively strained layer. The first and second tensilely strained layers can be formed of silicon, and the compressively strained layer can be formed of silicon and germanium.

22 Claims, 6 Drawing Sheets

U.S. PATENT DOCUMENTS

2006/0068557 A1\* 3/2006 Ochimizu et al. ............ 438/312
2006/0128105 A1\* 6/2006 Ouyang et al. ............... 438/300

FOREIGN PATENT DOCUMENTS

| JP | 9-219524 | \* | 8/1997 |
|----|----------|----|--------|
| JP | 20020011628 A1 | | 1/2002 |
| JP | 20020008289 A1 | | 2/2002 |

OTHER PUBLICATIONS

Griglione et al, "Diffusion of Single Quantum Well $Si_{l-x}Ge_x$/Si Layers Under Vacancy Supersaturation", Journal of Applied Physics, vol. 89, No. 5, Mar. 1, 2001.

B. Holländer et al., "Interdiffusion and Thermally Induced Strain Relaxation in Strained $Si_{l-x}Ge_x$/Si Superlattices", Physical Review B, vol. 46, No. 11, Sep. 15, 1992.

H.P. Zeindl et al, "Influence of Interdiffusion and Surfactants on Si/SiGe Herointerfaces", Applied Surface Science, 102 (1996), pp. 107-111.

H.P. Zeindl et al, "Diffusion Phenomena in MBE grown Si/SiGe Single Quantum Wells Studied by PL and TEM Measurements", Applied Surface Science, 92, (1996), pp. 552-556.

D.B. Aubertine et al. "Observation and Modeling of the Initial Fast Interdiffusion Regime in Si/SIGe Multilayers", Journal of Applied Physics, vol. 92, No. 9, Nov. 1, 2002; pp. 5027-5035'.

Y.Fu, et al. Quantum Mechanical Description of p-Type $Si/Si_{l-x}Ge_x$ Quantum Well Mosfet In Silicon-On-Insulator Technology; Solid-State Electronics, vol. 41, No. 5, 1997, pp. 729-732.

Hans von Känel et al., "Very High Hole Mobilities In Modulation-Doped Ge Quantum Wells Grown By Low-Energy Plasma Enhanced . . . ", Applied Physics Letters, vol. 80, No. 16, Apr. 22, 2002, pp. 2922-2923.

S. Madhavi et al., "Low-and High-Field Transport Properties of Modulation-Doped Si/SiGe and Ge/SiGe . . . ", Physical Review B, vol. 61, No. 24, Jun. 15, 2000, pp. 807-818.

D.K. Nayak et al., "Hole Confinement in a Si/GeSi/Si Quantum Well on SIMOX", IEEE Trans. on Electron Devices, vol. 43, No. 1, Jan. 1996, pp. 180-182.

X. Xiao, "Quantum Confinement Effects in Strained Silicon-Germanium Alloy Quantum Wells", Appl. Phys. Lett., 60 (17), Apr. 27, 1992, pp. 2135-2137.

Jin Hyeok Kim et al. "Fabrication of Thin Film Transistors Using a $Si/Si_{l-x}Ge_x$/Si Tripple Layer Film on a $SiO_2$ Substrate", IEEE Electron Device Letters., vol. 17, No. 5, May 1996, pp. 205-207.

M.Y.A. Yousif, et al., "Threshold Voltage and Charge Control Considerations in Double Quantum Well $Si/Si_{l-x}Ge_x$ p-Type Mosfets", Solid-State Electronics, vol. 42, No. 6, 1998, 951-956.

Michelle Griglione et al., "Diffusion of Ge in $Si_{l-x}Ge_x$/Si Single Quantum Wells in Inert and Oxidizing Ambients", Journal of Applied Physics, vol. 88, No. 3, Aug. 1, 2000, pp. 1366-1371.

Armstrong et al., Design of Si/SiGe heterojunction complementary metal-oxide-semiconductor transistors, IEEE, Electronic Devices Meeting, pp. 31.1.1-31.1.4, 1995.

Gupta et al., Improved hole mobilities and thermal stability in a strained-Si/strained-$Si_{l-y}$/strained-Si heterostructure grown on a relaxed $Si_{l-x}Ge_x$Buffer, Applied Physics Letters, AIP, vol. 86, No. 19, pp. 192104-1-192104-3, 2005.

Lauer et al., Fully Depleted n-MOSFETs on Supercritical Thickness Strained SOI, IEEE Electron Device Letters, vol. 25, No. 2, pp. 83-85, 2004.

Sadek et al, Si/SiGe CMOS Possibilities, Solid-State Elctronics, vol. 38, No. 9, pp. 1731-1734, 1995.

Sadek et al., Design of Si/SiGe heterojunction complementary metal-oxide-semiconductor transistors, IEEE Transactions of Electron Devices, vol. 43, No. 8, pp. 1224-1231.

Written Opinion and International Search Report PCT/US2005/021281 mailed Mar. 29, 2006.

\* cited by examiner

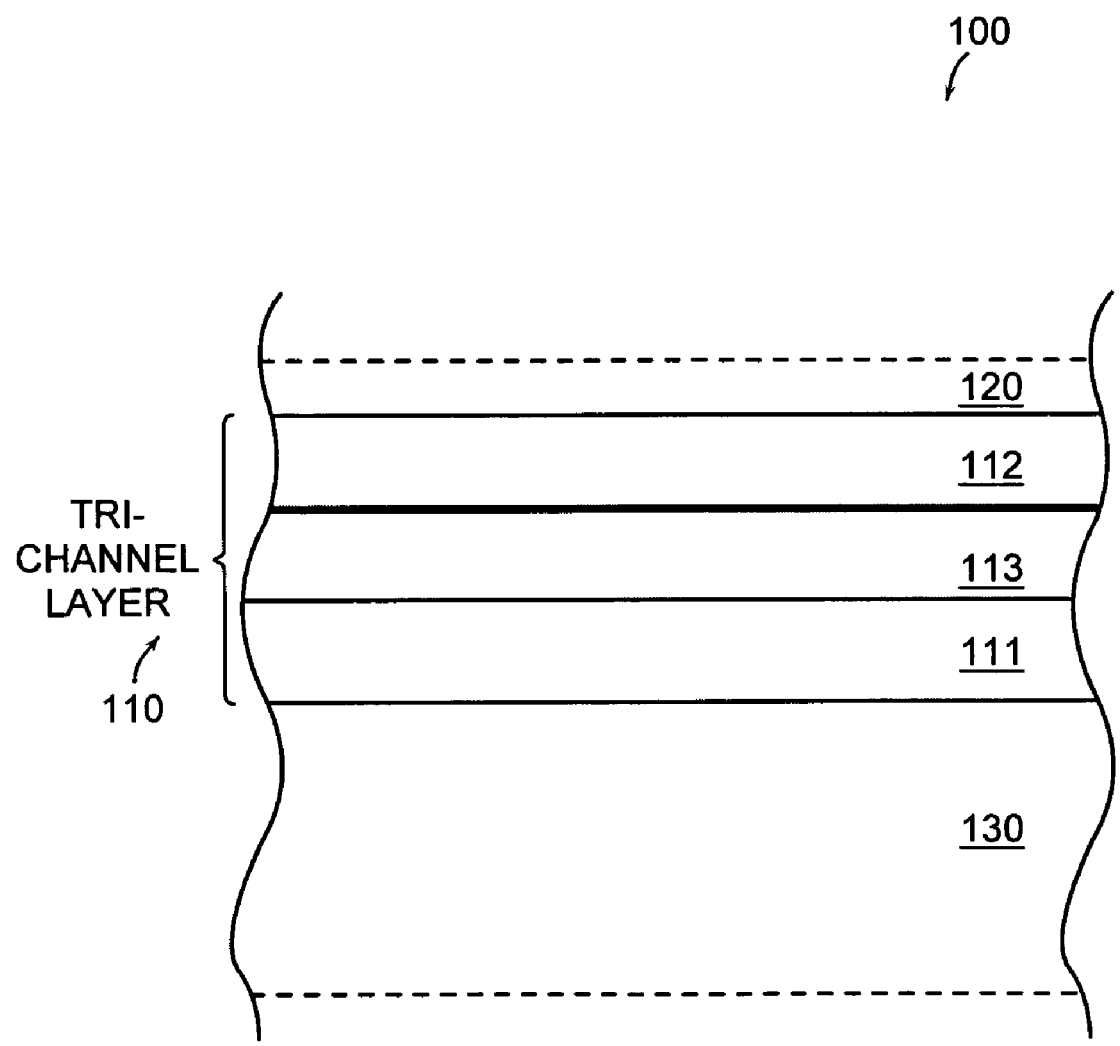
FIG. 1

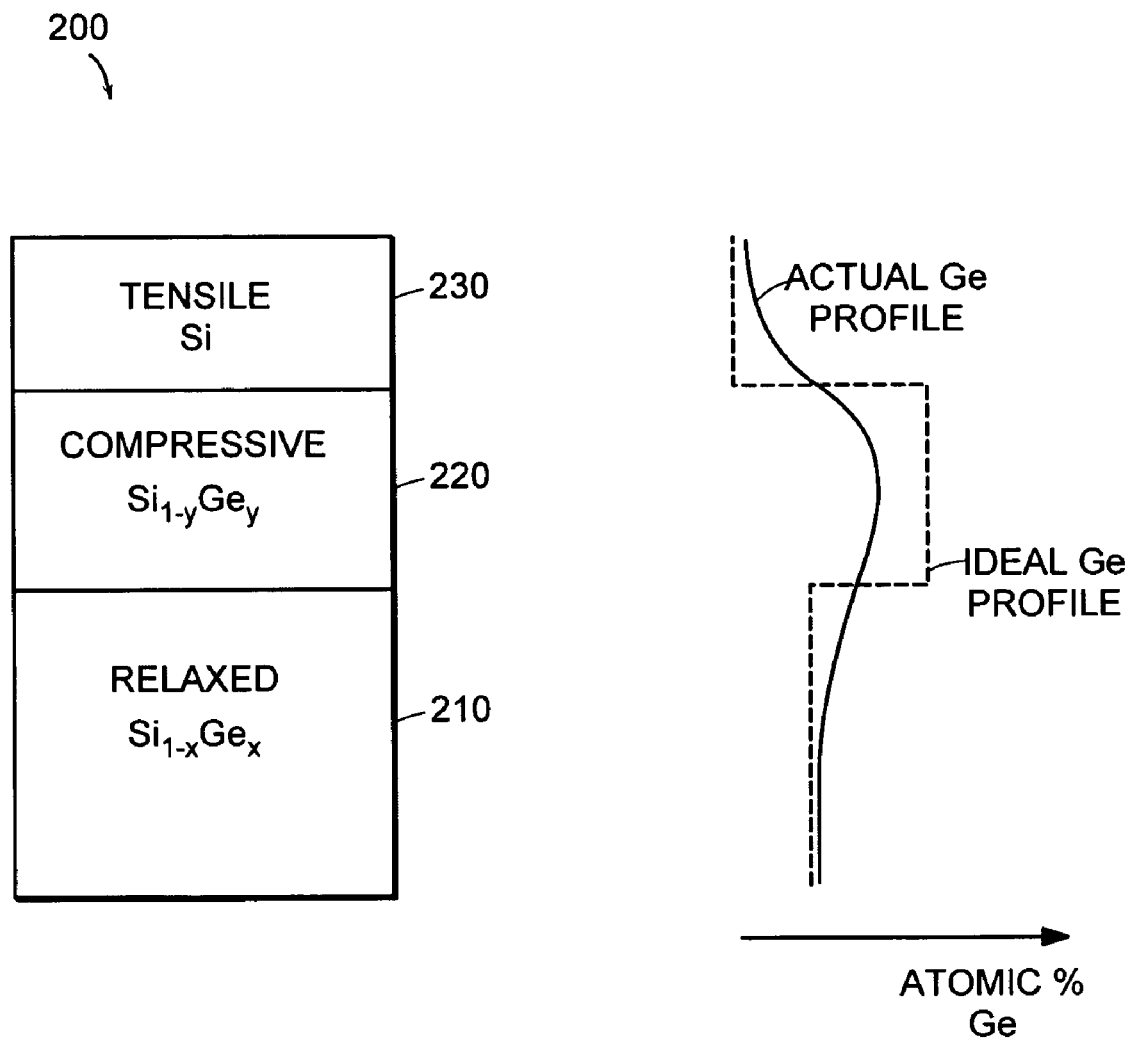
PRIOR ART
FIG. 2A
PRIOR ART
FIG. 2B

300
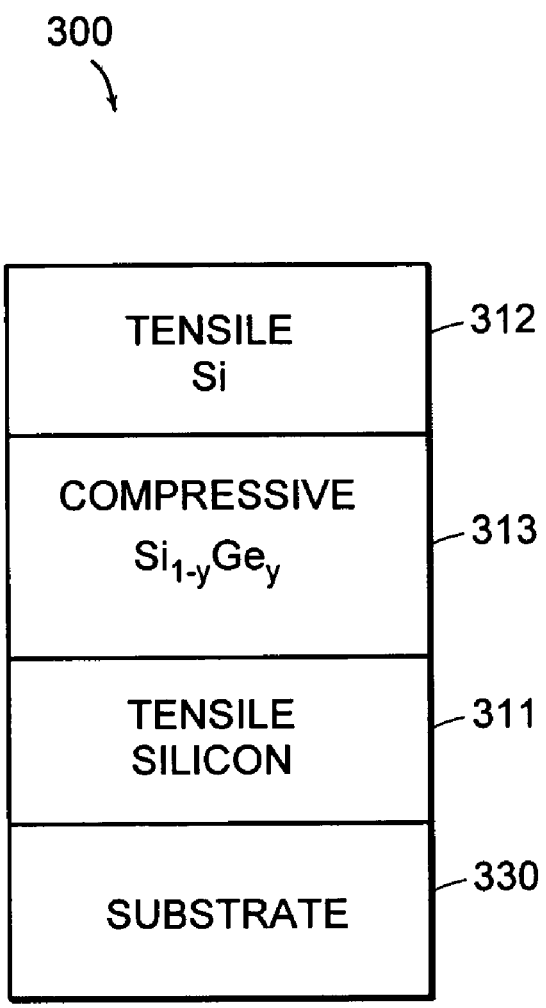
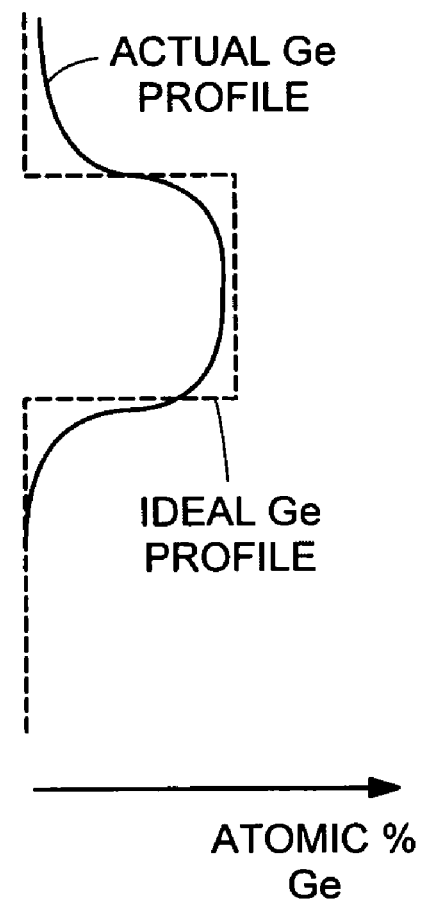
FIG. 3A
FIG. 3B

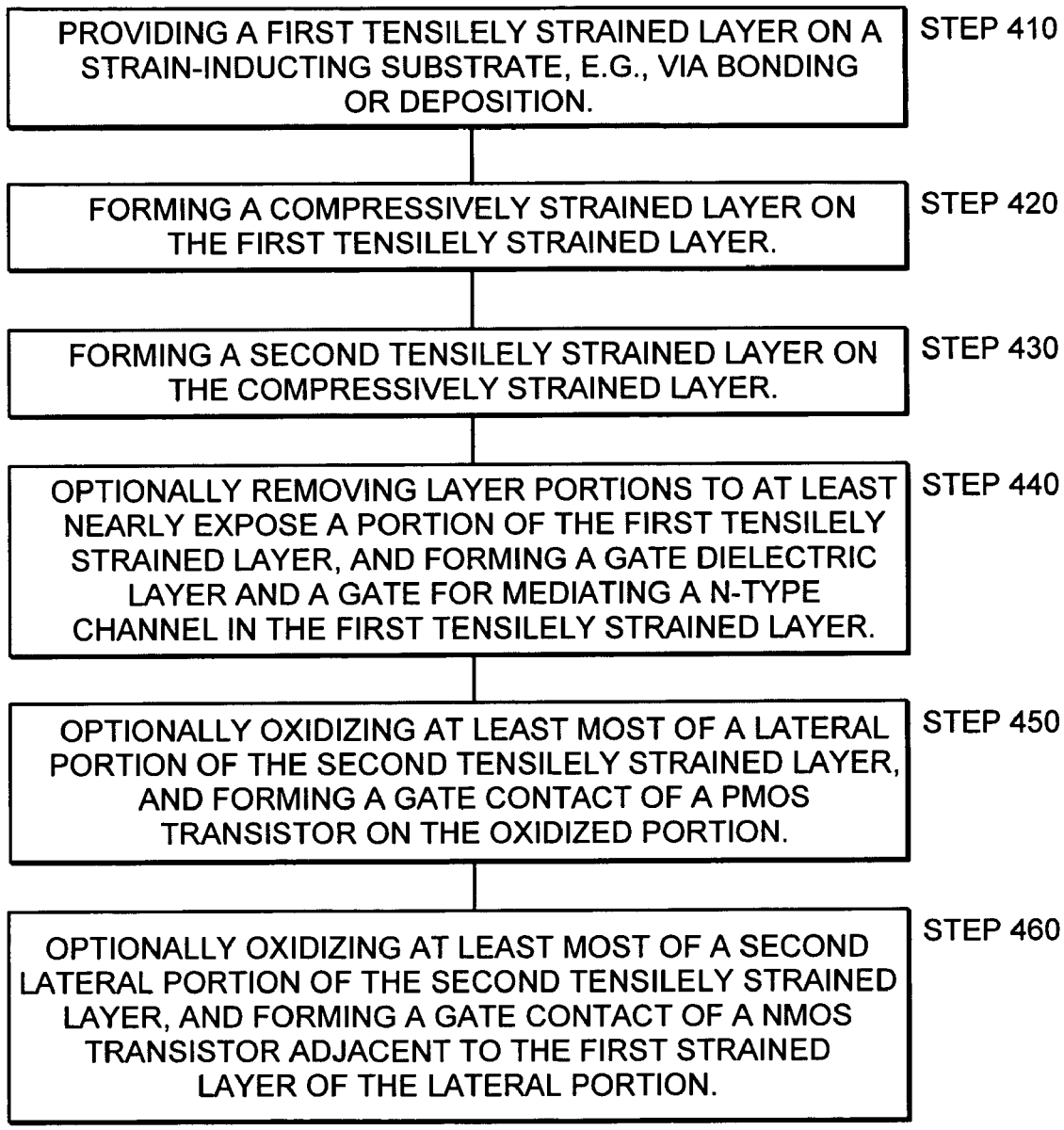
FIG. 4

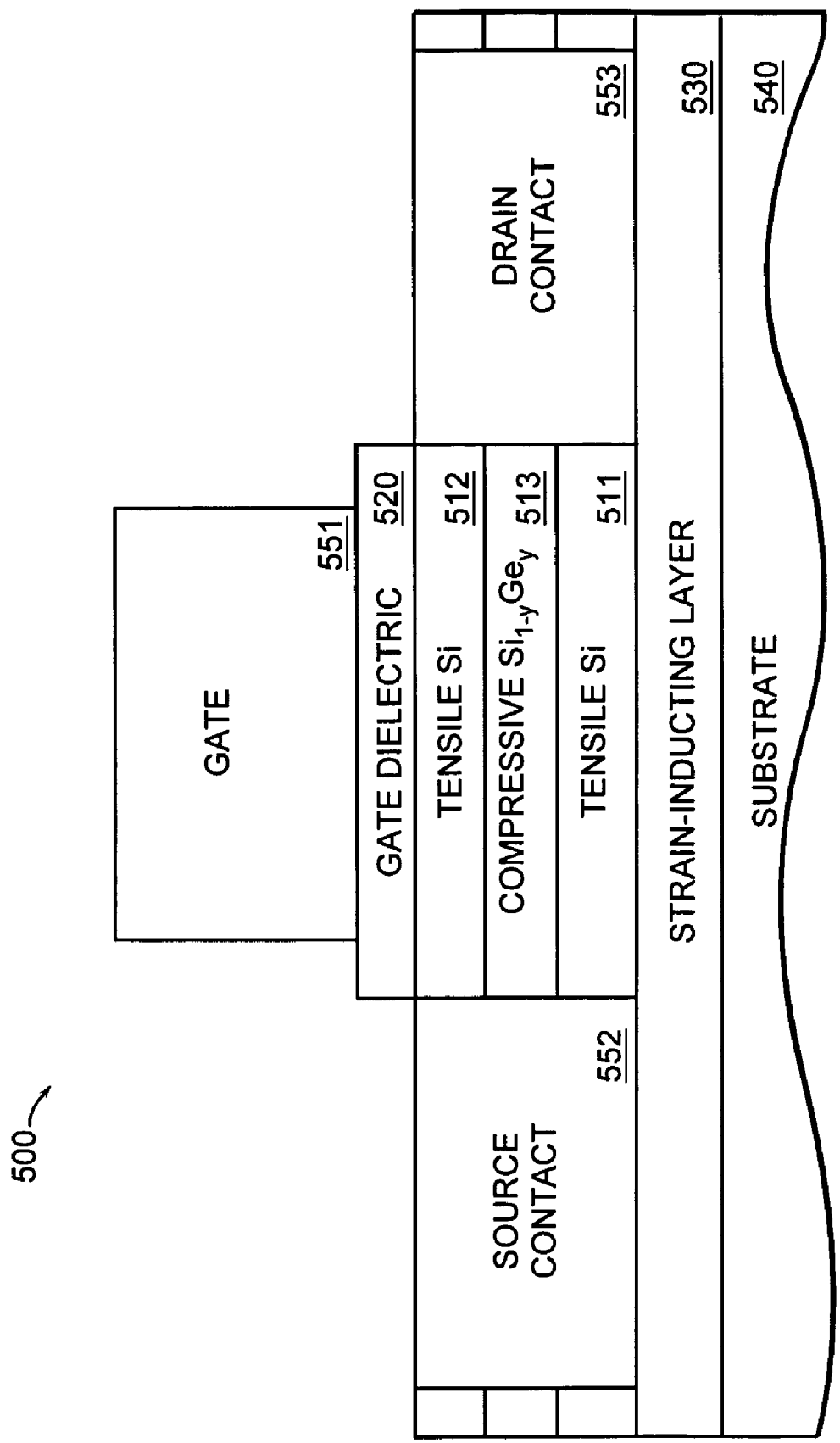
FIG. 5

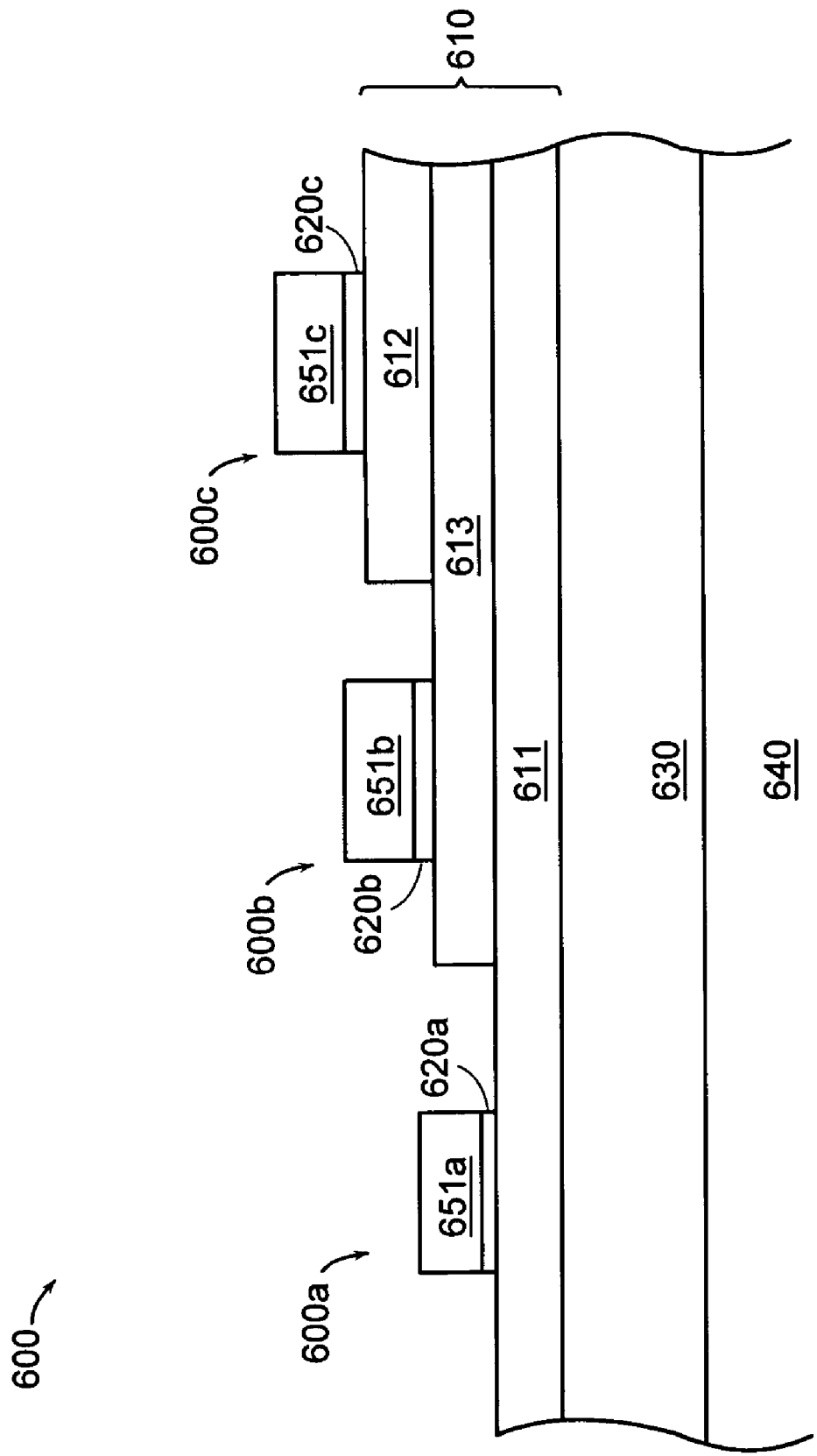
FIG. 6

STRAINED TRI-CHANNEL LAYER FOR SEMICONDUCTOR-BASED ELECTRONIC DEVICES

BACKGROUND OF INVENTION

1. Field of Invention

The invention relates to semiconductor-based electronic devices, and, more particularly, to the structure and fabrication of semiconductor-based substrates and electronic devices that include strained semiconductor layers.

2. Discussion of Related Art

Some advanced semiconductor-based devices include a semiconductor layer that is strained by application of a stress to provide improved performance of the devices. For example, metal-oxide-semiconductor (MOS) transistors having a channel formed in strained silicon or strained $Si_{1-y}Ge_y$ formed on unstrained, or relaxed, $Si_{1-x}Ge_x$, can exhibit improved carrier mobility in comparison to traditional p-type MOS (PMOS) and n-type MOS (NMOS) transistors. Strained-layer MOS transistors can be formed on "virtual substrates," which include a strained layer to provide compatibility with traditional silicon-based fabrication equipment and methods that were designed for use with conventional silicon wafers. A virtual substrate, in contrast, typically includes a strained silicon layer grown on a relaxed and/or graded $Si_{1-x}Ge_x$ layer in turn grown on a silicon substrate.

To fabricate high-performance devices on these platforms, thin strained layers of semiconductors, such as Si, Ge, or $Si_{1-y}Ge_y$, can be grown on the relaxed $Si_{1-x}Ge_x$ of a virtual substrate. The resulting biaxial tensile or compressive strain of the grown layers alters their carrier mobilities, enabling the fabrication of high-speed and/or low-power-consumption devices.

The relaxed $Si_{1-x}Ge_x$ layer of a virtual substrate can in turn be prepared by, e.g., wafer bonding or direct epitaxy on Si, or by epitaxy on a graded SiGe buffer layer in which the lattice constant of the SiGe material has been increased gradually over the thickness of the buffer layer. The virtual substrate may also incorporate buried insulating layers, in the manner of a silicon-on-insulator (SOI) wafer. Deposition of a relaxed graded SiGe buffer layer enables engineering of the in-plane lattice constant of a relaxed $Si_{1-x}Ge_x$ virtual substrate layer (and therefore the amount of strain the relaxed layer will induce in a strained silicon layer or other overlying layer), while also reducing the introduction of dislocations. The lattice constant of $Si_{1-x}Ge_x$ is larger than that of Si, and is a function of the amount of Ge in the $Si_{1-x}Ge_x$ alloy.

As a lattice-mismatched layer is deposited (such as a Si channel layer on a relaxed $Si_{1-x}Ge_x$ layer), the deposited layer will initially be strained to match the in-plane lattice constant of the underlying silicon substrate. Above a certain critical thickness of the deposited layer, however, misfit dislocations typically form at the layer interface. The layer can then relax to its inherent lattice constant due to mismatch accommodation by the misfit dislocations.

A structure that incorporates a compressively strained SiGe layer in tandem with a tensilely strained Si layer can provide enhanced electron and hole mobilities. In this "dual channel layer" structure, electron transport typically occurs within a surface tensilely strained Si channel and hole transport typically occurs within both the compressively strained $Si_{1-y}Ge_y$ layer below the Si layer and the Si layer at high gate overdrives.

Unfortunately, $Si_{1-x}Ge_x$-based substrates can increase the complexity of device fabrication. For example, the concentration profile of a Si-to-$Si_{1-x}Ge_x$ interface can deteriorate due to diffusion that occurs during elevated temperature processing steps. Moreover, the hole wave function in a $Si_{1-y}Ge_y$ dual channel layer can extend into an underlying oxide or relaxed SiGe layer. Thus, the desired hole mobility enhancement of a dual channel layer can be substantially less than theory predicts.

SUMMARY OF INVENTION

The invention arises, in part, from the realization that a significant portion of the decline in hole mobility in a $Si_{1-x}Ge_x$ channel layer can arise from a substantial loss of Ge concentration of the channel layer during device processing; a loss in Ge concentration can be substantially reduced by placing a diffusion barrier layer beneath the channel layer. The invention further arises from the realization that a strained silicon layer, disposed below and in contact with a $Si_{1-x}Ge_x$ channel layer, can effectively impede diffusion of Ge from the $Si_{1-x}Ge_x$ channel layer. A substantially pure Si layer provides a particularly effective barrier layer because of the relatively slow diffusivity of Ge in silicon at elevated processing temperatures. The substantial reduction of loss of Ge from the $Si_{1-x}Ge_x$ channel layer can substantially preserve the hole mobility increases desired from the $Si_{1-x}Ge_x$ channel layer by, for example, preserving a desirable level of Ge concentration in the $Si_{1-x}Ge_x$ channel layer, preserving a desirable level of strain in the $Si_{1-x}Ge_x$ channel layer, preserving a desirable thickness of the $Si_{1-x}Ge_x$ channel layer, reducing degradation of the interface between the $Si_{1-x}Ge_x$ channel layer and the barrier layer. The hole mobility may also be improved because a substantially pure Si layer can effectively confine holes within the $Si_{1-x}Ge_x$ channel layer.

Moreover, the barrier layer, such as one formed of strained silicon layer, can provide a channel layer for an n-type channel component, such as a NMOS transistor. For example, a conventional dual channel layer can be improved by disposing a strained silicon channel layer below the conventional dual channel layer. The strained silicon channel layer may both provide an n-type channel for some components of a device while also acting as an effective diffusion barrier during processing of the device.

Accordingly, in one aspect, the invention features a semiconductor-based structure. The structure includes a first tensilely strained layer, a second tensilely strained layer, and a compressively strained layer disposed between and in contact with the first and second tensilely strained layers. The first and second tensilely strained layers are each formed, for example, of silicon, and the compressively strained layer is formed, for example, of silicon and germanium. The compressively strained layer can provide all of, or a portion of, a p-channel, and the first and second tensilely strained layer can impede diffusion of, for example, germanium out of the compressively strained layer.

In another aspect, the invention features a semiconductor-based structure. The structure includes a substrate layer, a compressively strained semiconductor layer adjacent to the substrate layer to provide a channel for a component, and a tensilely strained semiconductor layer disposed between the substrate layer and the compressively strained semiconductor layer. The tensilely strained semiconductor layer is in contact with the compressively-strained semiconductor layer.

In still another aspect, the invention features a method for making an electronic device. The method includes providing, on a strain-inducing substrate, a first tensilely strained layer, forming a compressively strained layer on the first tensilely strained layer, and forming a second tensilely strained layer on the compressively strained layer. The first and second tensilely strained layers can be formed of silicon, and the compressively strained layer can be formed of silicon and germanium.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1 is a cross-sectional diagram of a portion of an embodiment of a semiconductor-based structure, according to principles of the invention;

FIGS. 2a and 2b are graphs of illustrative examples of an analog signal;

FIG. 2a is a cross-sectional diagram of an illustrative prior art dual channel layer structure;

FIG. 2b is a graphical illustration of ideal and actual Ge concentration profiles of the structure illustrated in FIG. 2a;

FIG. 3a is a cross-sectional diagram of an embodiment of a tri-channel layer structure, according to principles of the invention;

FIG. 3b is a graphical illustration of illustrative ideal and actual Ge concentration profiles of the structure illustrated in FIG. 3a;

FIG. 4 is a flowchart of an embodiment of a method for making an electronic device, according to principles of the invention;

FIG. 5 is a cross-sectional view of an embodiment of a transistor, according to principles of the invention; and FIG. 6 is a cross-sectional view of a portion of an embodiment of a semiconductor-based structure that includes two NMOS transistors and a PMOS transistor, according to principles of the invention.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing,", "involving," and variations thereof herein, is meant to encompass the items listed thereafter and equivalents thereof as well as additional items.

The present invention will now be described by way of specific, non-limiting, examples. It should be understood that the invention applies to substrates, devices, and fabrication methods beyond those discussed here. Specific structures, devices, and fabrication steps are meant for illustrative purposes only, and are non-limiting.

The invention provides, in part, improved semiconductor channel layer designs and fabrication methods. For example, embodiments of tri-channel layers, according to principles of the invention, have advantages relative to prior art dual channel layers. Various features of the invention are well suited to applications utilizing MOS transistors that include, for example, Si, $Si_{1-x}Ge_x$ and/or Ge layers in and/or on a virtual substrate.

The term "MOS" is used in this description to refer generally to semiconductor devices that include a conductive gate spaced at least by an insulating layer from a semiconducting channel layer. The terms "SiGe" and "$Si_{1-x}Ge_x$" are used in this description, depending on context, to interchangeably refer to silicon-germanium alloys. The term "silicide" is used in this description to refer to a reaction product of a metal, silicon, and optionally other components, such as germanium. The term "silicide" is also used, less formally, to refer to the reaction product of a metal with an elemental semiconductor, a compound semiconductor or an alloy semiconductor.

The term "virtual substrate" may refer to a substrate that includes a relaxed strain-inducing semiconductor layer, such as a relaxed SiGe layer, or may refer to a substrate comprising an insulator layer which maintains pre-induced strains in subsequently provided layers. The strain levels thus maintained are analogous to those induced by a strain-inducing semiconductor layer. For example, a strain of about 1.2% is induced in a SiGe layer by a virtual-substrate SiGe layer having a Ge concentration difference of approximately 30% (elemental concentrations in alloys are given herein in units of atomic %.) As described in more detail below, a strained layer can also be bonded to an insulator layer or to a semiconductor layer, and the strain can then be maintained without the presence of the original strain-inducing layer. Thus, language specifying the Ge content of the virtual substrate layer may also apply interchangeably to strained semiconductor layers that are equivalently strained by, and disposed adjacent to, an insulating substrate, where the strain in the semiconductor layers is maintained by the strong interface with the substrate.

With reference to FIG. 1, some general principles of the invention are described in broad overview. FIG. 1 is a cross-sectional view of a portion of an embodiment of a semiconductor-based structure 100. The structure 100 includes a tri-channel layer 110 and a strain-inducing substrate layer 130. The tri-channel layer 110 includes a first tensilely strained layer 111, a compressively strained layer 113 in contact with the tensilely strained layer 111, and optionally includes a second tensilely strained layer 112 in contact with the compressively strained layer 113.

The structure 100 can include one or more devices, such as MOS transistors, as described in more detail with reference to FIGS. 5 and 6. The MOS transistors can utilize the tri-channel layer 110 for their channels. For example, a MOS transistor can utilize one of the tensilely strained layers 111, 112 for a n-type channel, or can use the compressively strained layer 113 or tensilely strained layer 112 for a p-type channel.

As described in more detail below, the tri-channel layer 110, in various embodiments of the invention, has preferred layer thicknesses, preferred layer compositions, and/or preferred fabrication process steps. A tri-channel layer 110 that is shared by two or more electronic components can be continuous or discontinuous depending on the fabrication steps of a particular embodiment, according to principles of the invention. For example, a shared tri-channel layer 110, or portions of the layer 110, can extend continuously between two or more devices, or individual devices may be associated with spaced portions of the layer 110. Various implementations of the invention can improve carrier mobilities. For example, hole mobilities can be improved by providing a p-type channel that is more robust during fabrication.

The first and second tensilely strained layers 111, 112 can each be formed of silicon. As will be understood by one having ordinary skill in the semiconductor device arts, a silicon layer is formed substantially of silicon and can include trace intentional components, such as dopants, and can include trace impurities, such as oxygen and/or carbon. The compressively strained layer 113 can be formed of SiGe, which can similarly include intentional dopants and/or impurities.

The compressively strained layer 113 is disposed between, and in contact with, the first and second tensilely strained layers 111, 112. The first tensilely strained layer 111 and/or the second tensilely strained layer 112 can act as a diffusion barrier for the compressively strained layer 113. That is, during processing of the semiconductor-based structure, the strained layers 111, 112 can impede diffusion of one or more species out of the compressively strained layer 113.

For example, the compressively strained layer 113 and the tensilely strained layers 111, 112 can respectively be formed from $Si_{1-y}Ge_y$, and $Si_{1-x}Ge_x$, where X<Y. The strained layers 111, 112 can impede diffusion of Ge out of the $Si_{1-y}Ge_y$ of the compressively strained layer 113 because the diffusion coefficient of Ge in SiGe decreases with a decrease in Ge concentration. The strained layers 111, 112, when formed of SiGe, need not have the same Ge concentration, but they each should have a Ge concentration less than that of the compressively strained layer 113 to each impede diffusion of Ge out of the compressively strained layer 113. A suitable value of Y for enhanced hole mobility of $Si_{1-y}Ge_y$ in the compressively strained layer 113 can be in a range of, for example, about 0.2 to 1.0.

The compositions of the layers 111, 112, 113 can be selected to provide desired ratios of diffusion coefficients at processing temperatures of interest. Processing temperatures of interest can fall within a temperature range of, for example, about 300° C. to about 900° C. The composition of either or both of the tensilely strained layers 111, 112 can then be selected to provide, for example, a diffusivity of Ge in the tensilely strained layers 111, 112 that is less than about 95% of a diffusivity of Ge in the compressively strained layer 113. Thus, for example, at a processing temperature of 650° C. and a composition of the compressively strained layer 113 at 100% Ge, the composition of the tensilely strained layer 111 would be less than or equal to 50% Ge.

For a compressively strained layer 113 formed of $Si_{1-y}Ge_y$, the strained layers 111, 112 are preferably formed of silicon, i.e., with essentially no Ge, to act as optimal diffusion barriers. As described in more detail below, essentially pure Si has a Ge diffusion coefficient that is substantially less than the diffusion coefficient of Ge in $Si_{1-y}Ge_y$.

Referring now to FIGS. 2a, 2b, 3a, and 3b, the diffusion behavior of Ge can be qualitatively described. FIG. 2a is a cross-sectional diagram of a prior art dual-channel-layer structure 200. The structure 200 includes a tensile Si surface layer 230, a compressive $Si_{1-y}Ge_y$ buried layer 220, and a relaxed $Si_{1-x}Ge_x$ substrate layer 210.

FIG. 2b is a graph of illustrative Ge concentration profiles, both ideal and actual, of the structure 200 illustrated in FIG. 2a. Ideally, as illustrated, the Ge concentration of the compressive $Si_{1-y}Ge_y$ buried layer 220 would exhibit abrupt concentration changes at the interfaces with neighboring layers 210, 230. In actuality, after processing at elevated temperatures, a significant amount of Ge diffuses out of the $Si_{1-y}Ge_y$ buried layer 220, thus blurring the interfaces, and reducing the peak and average Ge concentration in the $Si_{1-y}Ge_y$ buried layer 220. Such elevated temperatures occur during, for example, growth of thermal oxides and activation of ion implants.

FIG. 3a is a cross-sectional diagram of an embodiment of a tri-channel layer structure 300, according to principles of the invention. The structure 300 includes a first tensile Si layer 311, a compressive $Si_{1-y}Ge_y$ buried layer 313, a second tensile Si surface layer 312 on the compressive $Si_{1-y}Ge_y$ buried layer 313, and a substrate layer 330.

FIG. 3b is a graph of illustrative Ge concentration profiles, both ideal and actual, of the structure 300 illustrated in FIG. 3a. The tensile layers 311, 312 of essentially pure silicon have substantially reduced out-diffusion of Ge from the compressive $Si_{1-y}Ge_y$ buried layer 313 during elevated temperature processing. The compressive $Si_{1-y}Ge_y$ buried layer 313 can thus provide a hole mobility that is substantially improved over that of the compressive $Si_{1-y}Ge_y$ buried layer 220 illustrated in the example of FIG. 2a. The layers can themselves be formed at relatively low temperatures to essentially avoid interdiffusion during layer formation. For example, Si and SiGe can be grown at temperatures in a range of, for example, 350° C. to 550° C.

Referring again to FIG. 1, the semiconductor-based structure 100 can include a dielectric layer, which can serve as a gate dielectric, and which can be in contact with the second tensilely strained layer 112. Optionally, a dielectric layer may be in contact with the compressively strained layer 113 in some regions and/or in contact with the first tensilely strained layer 111 in some regions, i.e., the second tensilely strained layer 112 may be thinner or absent in some portions of the structure 100, and the compressively strained layer 113 may be thinner or absent in some portions of the structure 100.

The tri-channel layer 110 is in contact with the underlying strain-inducing substrate layer 130. The strain-inducing substrate layer 130 can substantially control the level of strain in the compressively strained layer 113 and in the tensilely strained layers 111, 112. The strain-inducing substrate layer 130 can be, for example, a relaxed SiGe layer, a graded SiGe layer, or an oxide layer. The first tensilely strained layer 111 can be formed in contact with the strain-inducing substrate layer 130 by, for example, deposition or bonding.

The strain-inducing substrate layer 130 can be, or can be formed on, a graded SiGe layer. The graded SiGe layer can have a grading rate of, for example, 10% Ge/μm, and a thickness in a range of, for example, 2 μm to 9 μm. The graded layer may grown at a temperature in a range of, for example, 400° C. to 1100° C.

The strain-inducing substrate layer 130 can be a relaxed SiGe layer, which can be grown on a graded SiGe layer. The relaxed layer can be formed of $Si_{1-x}Ge_x$ with a uniform concentration having X in a range of about 20% to 90%. The relaxed layer can have a thickness in a range of, for example, about 0.2 μm to about 2.0 μm.

The first tensilely strained layer 111 can formed of silicon. The thickness of the first tensilely strained layer 111 can be selected to be greater than a diffusion length of germanium in the first tensilely strained layer 111. For example, at 950° C., the diffusion length of Ge in Si for 1 hour of processing is approximately 8 nm. The diffusion lengths generally decrease exponentially with decreasing temperatures. The first tensilely strained layer 111 can be formed of silicon having a thickness in a range of, for example, about 0.5 nm to about 20 nm. Such a first tensilely strained layer 111 can provide an effective diffusion barrier to block Ge of a SiGe compressively strained layer 113 from diffusing to the strain-inducing substrate layer 130.

The thickness of the first tensilely strained layer 111 can be chosen to substantially prevent overlap of Ge diffusion profiles in the first tensilely strained layer 111, when the Ge diffusion profiles arise from Ge diffusing from an overlying compressively strained layer 113 and from an underlying strain-inducing layer 130, for processing temperatures of interest. The first tensilely strained layer 111 can also help to confine hole carriers in the compressively strained layer 113.

For example, a first tensilely strained layer 111 formed of silicon can be particularly effective for confinement of holes in a SiGe compressively strained layer 113.

The thickness of the first tensilely strained layer 111 can be chosen to be less than the thickness of the second tensilely strained layer 112. Such thickness selections can be suitable when, for example, the second tensilely strained layer 112 is used to support a channel for a NMOS component. The thickness of the first tensilely strained layer 111 can be, for example, less than about 1.5 nm.

The compressively strained layer 113 can be formed of $Si_{1-y}Ge_y$ with a Ge concentration greater than that of Ge in a SiGe strain inducing layer 130. The Ge concentration can have a value in a range of, for example, 1% to 100%. The thickness can have a value in a range of, for example, 1 nm to 50 nm. It can be desirable to select a relatively large thickness for the compressively strained layer 113 to decrease the rate of decline of Ge concentration in the layer 113. Moreover, it can be desirable to select a thickness that is about equal to or greater than the hole wavelength to reduce leakage of holes out of the layer 113.

Hole mobility can increase with the level of compressive strain in a SiGe layer. Thus, a Ge concentration of a SiGe compressively strained layer 113 can also be increased relative to the Ge concentration in an underlying SiGe strain-inducing layer 130 to improve hole mobility in the compressively strained layer 113. An underlying barrier layer can help to preserve this benefit.

A maximum suitable thickness of the compressively strained layer 113 can be selected as the maximum thickness obtainable without significant production of dislocations. As known to one having ordinary skill in the SiGe growth arts, a critical thickness is associated with a thickness value at which a SiGe layer begins to relax via the introduction of dislocations. A greater thickness prior to relaxation can be obtained by, for example, growing the SiGe layer at lower temperatures.

The second tensilely strained layer 112, when formed of silicon, can have a thickness value in a range of, for example 0.5 nm to 30 nm. A lesser thickness can be selected when the second tensilely strained layer 112 is intended for use only as, for example, a Ge diffusion barrier during bonding to an oxide layer and/or as a capping layer for PMOS devices. A greater thickness can be selected when the layer 112 is intended for use as, for example, a n-type channel layer. A thickness of, for example, less than about 3 nm, as little as about 1 nm, can be satisfactory for the former uses, while a thickness of greater than about 6 nm, preferably greater than 7 nm, can be satisfactory for the latter use. Moreover, the layer 112, when formed of silicon, can provide a higher quality interface with a gate dielectric than typically available for a SiGe latter.

A silicon layer can provide a particularly good diffusion barrier for Ge in a SiGe layer because the diffusivity of Ge in SiGe is a strong function of Ge concentration. For example, the diffusivity of Ge increases over a range of about eight orders of magnitude as the concentration of Ge in $Si_{1-y}Ge_y$ varies from y=0 to y=1. Accordingly, an effectively pure Si layer, or one with effectively low Ge concentration, can be suitable in a first and/or second tensilely strained layer 111, 112. Moreover, the strain of the tensilely strained layer 111 is advantageous because the diffusivity of Ge in Si can decrease with increasing strain. The upper value of Ge concentration in an effective diffusion barrier depends on the concentration of Ge in the compressively strained SiGe layer. Thus, a difference of 10% in the Ge concentration, between the compressively strained layer 113 and the tensilely strained layer 111 corresponds to a diffusion coefficient which is about 6 times less in the tensilely strained layer 111 than in the compressively strained layer 113.

An effective diffusion barrier can also reduce, or substantially prevent, a loss in thickness of the compressively strained layer 113 that may occur during elevated-temperature processing. For example, the loss of Ge from a $Si_{1-y}Ge_y$ layer can lead to shrinkage of the layer thickness. Thus, reducing loss of Ge can help to preserve the $Si_{1-y}Ge_y$ layer thickness. The presence of a tensilely strained layer 111 layer rich in Si can also preserve the abrupt band offset which can be essential for confining holes in the compressively strained layer 113.

In one alternative embodiment of the structure 100, the compressively strained layer 113 is 50% Ge, the tensilely strained layers 111, 112 are silicon, and the strain-inducing layer 130 is SiGe having 20% Ge. This embodiment can provide symmetrical mobility enhancement for electrons and holes, with mobility increased by a factor of about two. Conventional mask sets, for example, can be used to fabricate this embodiment because the relative sizes of n-type and p-type components would not require alteration to accommodate an asymmetrical improvement in mobility. Further, SiGe having a Ge concentration of 50% can be easier to deposit, and can provide a greater thermal budget than SiGe having greater concentrations of Ge. If the Ge concentration is higher, for example, by 10%, the peak Ge concentration would decrease in a SiGe compressively strained layer 113 in about half the processing time. More generally, some embodiments of the structure 100 have strained layers 111, 112, 113 each with strains greater than about 0.25%.

FIG. 4 is a flowchart of an embodiment of a method 400 for making an electronic device, according to principles of the invention. The method may be used to fabricate, for example, the semiconductor-based structure 100. The method 400 includes providing a first tensilely strained layer on a strain-inducing substrate (Step 410), forming a compressively strained layer on the first tensilely strained layer (Step 420), and forming a second tensilely strained layer on the compressively strained layer (Step 430). The order of description or listing of steps of the method 400 should not be construed to require a particular order, nor to preclude simultaneity of any steps.

The first tensilely strained layer can be formed of silicon, the second tensilely strained layer can be formed of silicon, and the compressively strained layer can be formed of silicon and germanium. The first tensilely strained layer on the strain-inducing substrate can be provided by bonding the a tensilely strained layer to a strain-inducing substrate. The strain-inducing substrate can include a layer in contact with the first tensilely strained layer. The layer can be, for example, an oxide layer or a relaxed SiGe layer.

The method can include steps relating to formation of one or more components having an n-type channel and/or one or more components having p-type channels. Both the n-type and p-type components can be fabricated on a second tensilely strained layer. In addition, these components could be fabricated on any other layer of the tri-layer structure. For example, in relation to forming a n-type channel component, the method 400 can include removing portions of the second tensilely strained layer and the compressively strained layer to expose, or nearly expose, a portion of the first tensilely strained layer, forming a gate dielectric layer adjacent the exposed portion of the first tensilely strained layer, and then forming a gate in contact with the gate dielectric layer for mediating a n-type channel in the first tensilely strained layer (Step 440). The gate dielectric layer can be in contact with, for example, the portion of the first tensilely strained layer or a remaining portion of the compressively strained layer.

In relation to forming a p-type channel component, the method 400 can include, for example, oxidizing all or most of a lateral portion of the second tensilely strained layer, and forming a gate contact of a p-type channel component on the oxidized portion (Step 450). In relation to forming multiple components of a device, the method 400 can also include, for example, oxidizing all or most of a second lateral portion of the second tensilely strained layer, and forming a gate contact of a NMOS transistor adjacent to the first strained layer of the lateral portion (Step 460). Thus, in various alternative embodiments of the method 400, according to principles of the invention, a fabricated device can include components that utilize the first tensilely strained layer or the second tensilely strained layer for a n-type channel, and/or include components that utilize the compressively strained layer and/or the second tensilely strained layer for a p-type channel.

The method 400 can employ, for example, thin-film deposition techniques known to one having skill in the semiconductor fabrication arts. The techniques can be modified, according to principles of the invention, to improve surface planarity of the deposited films; poor planarity can arise during deposition of strained films.

Layers can be deposited, for example, at relatively low temperatures to improve planarity. For example, silicon may be deposited at about 650° C. substantially without causing undulations on underlying SiGe having a Ge concentration of 20%, while a Si deposition temperature of about 550° C. is preferable for underlying SiGe having a concentration of 50%. Alternatively, where an underlying layer may lose planarity at a desired deposition temperature of a subsequent film, the subsequent film can be initially deposited at a lower temperature, and the deposition can subsequently proceed at higher temperatures to obtain a faster growth rate. A substantially planar layer may be identified by, for example, an average surface roughness wavelength that is greater than an average wavelength of a carrier in the compressively strained layer, and/or an average roughness height less than about 10 nm.

A compressive SiGe layer can experience island formation during deposition. To mitigate this problem, a SiGe compressively strained layer 113 can be deposited at a temperature in a range of, for example, 350° C. to 450° C. A Si second tensilely strained layer 111 can then be grown without causing substantial undulation of the underlying SiGe compressively strained layer 113 by initially growing a Si layer at relatively low temperature, and then increasing the growth temperature after a capping layer has formed.

Referring to FIGS. 5 and 6, the tri-channel layer 110 may provide both an n-channel for at least one NMOS component and a p-channel for at least one PMOS component. The components may be MOS transistors, for example, NMOS and PMOS transistors in an inverter. As described above, the tri-channel layer 110 provides a tri-channel via appropriate selection, in part, of layer thicknesses and compositions.

FIG. 5 is a cross-sectional view of an embodiment of a transistor 500 that can be included in a structure, such as the structure 100, according to principles of the invention. The transistor 500 includes a gate contact 551, source and drain contacts 552, such as silicide contacts, a gate dielectric layer 520, and a tri-channel layer including first and second tensilely strained silicon layers 511, 512 and a compressively strained $Si_{1-y}Ge_y$ layer 513 between the tensilely strained layers 511, 512. The transistor also includes a strain-inducing substrate layer 530, such as a relaxed $Si_{1-x}Ge_x$ layer or an oxide layer, and a silicon substrate 540. The tri-channel layer, the strain-inducing layer 530, and the substrate 540 may be shared with other components in a structure. The strain-inducing substrate layer 530 can also be provided by, for example, a virtual substrate.

The gate contact 551 can include, for example, a doped conductive polycrystalline silicon lower portion in contact with the gate dielectric 520 and a gate silicide upper portion. Alternatively, the gate contact 551 may be formed of another conductive material, such as a doped semiconductor, e.g., polycrystalline SiGe, a metal, e.g., titanium (Ti), tungsten (W), molybdenum (Mo), tantalum (Ta), or iridium (Ir); or metal compounds that provide an appropriate workfunction, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$).

The tensilely strained layers 511, 512 and the compressively strained layer 513 may be epitaxially grown on, for example, a strain-inducing layer 530 of relaxed $Si_{1-x}Ge_x$. The source and drain contacts 552, 553 can be formed, for example, by depositing a metal layer and reacting the metal layer with the tri-channel layer and a relaxed $Si_{1-x}Ge_x$ strain-inducing layer 530. One having ordinary skill in the semiconductor fabrication arts will recognize that other layer formation techniques, including, for example, ion implantation, can be used to fabricate the above-described embodiments of the invention.

The gate dielectric 520 is formed on the second tensilely strained layer 512. The gate dielectric 520 can be formed by, for example, consuming a portion of the surface of the second tensilely strained layer 512. The dielectric layer 520 can be formed by various methods conventional in the art, e.g., thermal oxidation or a deposition technique.

The gate dielectric 520 can be, for example, a 1.0 to 10.0 nm thick layer of silicon dioxide. Alternative embodiments of the transistor 500 include other suitable dielectric materials, e.g., silicon oxynitride, silicon nitride, a plurality of silicon nitride and silicon oxide layers, or a high-k dielectric. Alternative dielectric materials may be employed when, for example, a thin effective gate oxide thickness is desired, for example, equivalent to an $SiO_2$ layer thickness of 2.0 nm or less.

The transistor 500, according to principles of the invention, can be implemented as a NMOS or a PMOS component. The transistor 500 can include, for example, different doping types and levels in source, drain, and channel layer regions. A structure can thus include NMOS and PMOS transistors 500, utilizing a common tri-channel layer, and both NMOS and PMOS components can provide improved channel performance.

Referring now to FIG. 6, features of the invention are described that permit devices that include multiple p-type channel and n-type channel components that in turn can each utilize a desired one of the strained layers of a shared tri-channel layer, such as the layer 110 described with reference to FIG. 1, for their channels. FIG. 6 is a cross-sectional view of a portion of an embodiment of a semiconductor-based structure 600 that includes two NMOS transistors 600a, 600c and a PMOS transistor 600b, according to principles of the invention. In an alternative embodiment, according to principles of the invention, the transistor 600c is a PMOS transistor. The transistors 600a, 600b, 600c include gate contacts 651a, 651b, 651c, and gate dielectric layers 620a, 620b, 620c. For simplicity, some components common to conventional MOS transistors, such as source and drain contacts, are not shown, as will be understood by one having ordinary skill in the transistor arts. The transistors 600a, 600b, 600c share a tri-channel layer 610 that includes first and second tensilely strained silicon layers 611, 612 and a compressively strained $Si_{1-y}Ge_y$ layer 613 disposed between the tensilely strained layers 611, 612. The structure 600 also includes a strain-inducing substrate layer 630, such as a relaxed $Si_{1-x}Ge_x$ layer or an oxide layer, and a silicon substrate 640.

The structure 600 can include, for example, an n-type implanted dopant well, within which the PMOS transistor 600b can reside. The dopant well can be formed via any of a variety of methods known in the semiconductor fabrication arts. The transistors 600a, 600b, 600c can be electrically isolated from each other via, for example, shallow trench isolation (STI), as will be understood by one having ordinary skill in the art. STI portions are preferably deep enough to cross the tri-channel layer 610, ending at least at or in the strain-inducing substrate layer 630. In alternative embodiments of the structure 600, the STI portions are absent or replaced by other isolation means. For example, one embodiment includes semi-recessed oxide isolation (S-ROX) portions.

As illustrated in FIG. 6, the thicknesses of the layers 611, 612, 613 are different in different portions of the tri-channel layer 610 to provide desired channel properties for the transistors 600a, 600b, 600c, which utilize the different portions. The different thicknesses of different portions of the layers 611, 612, 613 of the tri-channel layer 610 can be provided by, for example, depositing the layers with different thicknesses and/or by removing portions of one or more of the layers 611, 612, 613 selectively from different portions of the tri-channel layer 610. Thus, for example, the gate dielectric 620a, 620c of the NMOS transistors 600a, 600c is in contact with either the first or second tensilely strained silicon layer 611, 612. The gate dielectric of the PMOS transistor 600b is in contact with the compressively strained $Si_{1-y}Ge_y$ layer 613.

Moreover, the second silicon tensilely strained layer 612 can remain in the region of the PMOS transistor 600b, but be provided with a less thickness than in the region of the NMOS transistor 600c. The thinner region of the silicon tensilely strained layer 613 can provide a further enhancement of the hole mobility in the channel for the PMOS transistor 610b, and can reduce undesirable effects as may arise from the presence of a thicker tensile layer 612 in the tri-channel layer 610 in the region of the PMOS transistor 600b. In some implementations (as illustrated), the tensile layer 613 is thinner or absent in the PMOS transistor 600b.

Having thus described several aspects of at least one embodiment of this invention, it is to be appreciated various alterations, modifications, and improvements will readily occur to those skilled in the art. For example, strained layers can be formed from elemental, alloy, and compound semiconductors other than Si, Ge, and SiGe. For example, a compressively strained layer can include at least two group III and V elements, such as indium gallium arsenide, indium gallium phosphide, and gallium arsenide. For example, a compressively strained layer can include at least two group II and VI elements, such as zinc selenide, sulphur, cadmium telluride, and mercury telluride. Such alterations, modifications, and improvements are intended to be part of this disclosure, and are intended to be within the spirit and scope of the invention. Accordingly, the foregoing description and drawings are by way of example only.

What is claimed is:

1. A semiconductor-based structure, comprising:
a first tensilely strained layer consisting essentially of silicon;
a second tensilely strained layer consisting essentially of silicon;
a compressively strained layer forming a p-channel, and consisting essentially of silicon and germanium disposed between and in contact with the first and second tensilely strained layers, the first and second tensilely strained layers impeding diffusion of germanium out of the compressively strained layer;
a substrate in contact with the first tensilely strained layer that induces tensile strain into the first tensilely strained layer;
a gate disposed over the second tensilely strained layer to establish the p-channel;
a source region at a first side of the p-channel; and
a drain region at a second side of the p-channel.

2. The semiconductor-based structure of claim 1, wherein the first tensilely strained layer has a thickness selected to support an n-type channel.

3. The semiconductor-based structure of claim 2, wherein the thickness is in a range of about 5 nm to about 20 nm.

4. The semiconductor-based structure of claim 2, wherein the second tensilely strained layer has a thickness that is insufficient to support an effective n-type channel.

5. The semiconductor-based structure of claim 2, wherein the thickness of the second tensilely strained layer is in a range of about 1 nm to less than 7 nm.

6. The semiconductor-based structure of claim 1, wherein the first tensilely strained layer has a thickness greater than a diffusion length of germanium.

7. The semiconductor-based structure of claim 1, wherein the first tensilely strained layer has a thickness less than a thickness of the second tensilely strained layer.

8. The semiconductor-based structure of claim 7, wherein the thickness of the first tensilely strained layer is less than about 1.5 nm.

9. The semiconductor-based structure of claim 1, further comprising a NMOS component comprising a gate dielectric layer adjacent to the first tensilely strained layer, and a second gate in contact with the gate dielectric layer to form a n-type channel in at least one of the first and second tensilely strained layers.

10. The semiconductor-based structure of claim 9, wherein the n-type channel is formed at least mostly in the second tensilely strained layer.

11. The semiconductor-based structure of claim 9, wherein the gate dielectric layer is in contact with one of the second tensilely strained layer and the compressively strained layer.

12. The semiconductor-based structure of claim 11, further comprising a PMOS component comprising a second gate dielectric layer adjacent to the compressively strained layer, and a third gate in contact with the second gate dielectric layer to form a p-type channel at least mostly in the compressively strained layer.

13. The semiconductor-based structure of claim 1, wherein the substrate comprises silicon and germanium in contact with the first tensilely strained layer.

14. The semiconductor-based structure of claim 1, wherein the substrate comprises an oxide in contact with the first tensilely strained layer.

15. A semiconductor-based structure, comprising:
a substrate;
a compressively strained semiconductor layer adjacent to the substrate to provide a channel of a semiconductor component;
a tensilely strained semiconductor layer disposed between the substrate and the compressively strained semiconductor layer, and in contact with the compressively-strained semiconductor layer, the tensilely strained semiconductor layer impeding diffusion of a species out of the compressively strained semiconductor layer;

a gate disposed over the compressively strained layer to establish the channel;

a source region at a first side of the channel;

a drain region at a second side of the channel; and a second tensilely strained layer consisting essentially of a semiconductor in contact with the compressively strained layer on an opposite side of the compressively strained layer relative to the tensilely strained layer;

wherein the substrate induces tensile strain into the tensilely strained semiconductor layer.

16. The semiconductor-based structure of claim 15, wherein the compressively strained semiconductor layer consists essentially of silicon and germanium, the tensilely strained semiconductor layer consists essentially of silicon, and the species is germanium.

17. The semiconductor-based structure of claim 15, further comprising at least one PMOS component that primarily utilizes the compressively strained layer for a p-type channel.

18. The semiconductor-based structure of claim 17, further comprising at least one NMOS component that primarily utilizes the tensilely strained layer for a n-type channel.

19. The semiconductor-based structure of claim 15, wherein, for a temperature in a range of about 300° C. to about 1000° C., the composition of the tensilely strained layer is selected to provide a diffusivity of Ge in the tensilely strained layer that is less than about 95% of a diffusivity of Ge in the compressively strained layer.

20. A method for making an electronic device, comprising:

providing, on a substrate, a first tensilely strained layer consisting essentially of silicon, wherein the substrate induces tensile strain into the first tensilely strained layer;

forming a compressively strained layer on the first tensilely strained layer, the compressively strained layer consisting essentially of silicon and germanium;

forming a second tensilely strained layer on the compressively strained layer, the second tensilely strained layer consisting essentially of silicon;

forming a gate over the second tensilely strained layer;

forming a source region at a first side of the compressively strained layer; and forming a drain region at a second side of the compressively strained layer.

21. The method of claim 20, wherein the substrate comprises a layer in contact with the first tensilely strained layer, the layer consisting of one of an oxide and relaxed SiGe.

22. The method of claim 21, wherein providing the first tensilely strained layer comprises bonding the first tensilely strained layer to the substrate.

* * * * *